(12) United States Patent
Alam et al.

(10) Patent No.: US 6,261,857 B1
(45) Date of Patent: Jul. 17, 2001

(54) PROCESS FOR FABRICATING AN OPTICAL WAVEGUIDE

(75) Inventors: Muhammad Ashrafal Alam, Scotch Plains; Mark S. Hybertsen, West Orange; Roosevelt People, Plainfield, all of NJ (US)

(73) Assignee: Agere Systems Optoelectronics Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/097,924

(22) Filed: Jun. 17, 1998

(51) Int. Cl.[7] .................................................. H01L 21/00
(52) U.S. Cl. ................................................................ 438/31
(58) Field of Search ............................ 438/31, 4; 385/14

(56) References Cited

PUBLICATIONS

"Selective–area low–pressure MOCVD of GaInAsP and related materials on planar InP substrates", M. Gibbon et al., Semiconductor Sci. Technol., vol. 8, pp. 998–1010 (no month given), 1993.*
"Integrated optoelectronic devices by selective–area epitaxy", A.M. Jones et al., SPIE, vol. 2918, pp. 145–154, Nov. 1996.*
"Selective–Area Low–Pressure MOCVD of GaInAsP and Related Materials on Planar InP Substrates", by Gibbon, M. et al. Semiconductor Sci. Technol., pp. 998–1010 (1993).
"Integrated Optoelectric Devices by Selective–Area Epitaxy", by Jones, A. M. et al., SPIEvol. 2918, pp. 145–154 (Nov. 18–19, 1996).

"Selective and Non–Planar Epitaxy of InP, GaInAs and GaInAsP Using Low Pressure MOCVD", by Thrush, R. E. et al., Journal of Crystal Growth,124, pp. 249–254 (1992).
"Simultaneous Thickness and Compositional Uniformity in Selective MOVPE Growth", by Ekawa, M, et al., Fujitsu Laboratories Ltd., pp. 337–340. No Date.

* cited by examiner

Primary Examiner—Keith Christianson
(74) Attorney, Agent, or Firm—Richard J. Botos

(57) ABSTRACT

A process for fabricating a waveguide with a desired tapered profile is disclosed. The waveguide has a first section with a first height and a second section with a second height. The first height is greater than the second height. The waveguide height tapers from the first height to the second height. The waveguide is a compound semiconductor material and is formed using selective area growth. In selective area growth, a dielectric mask is formed on a substrate. The dimensions of the dielectric mask are selected to provide a waveguide with the desired dimensions. The compound semiconductor material is deposited on the substrate using chemical vapor deposition. The dielectric mask affects the rate at which the compound material is deposited in areas of the substrate proximate to the mask. Therefore, the profile of the waveguide formed using the selected mask dimensions is modeled and compared with the desired profile. If modeled profile is not acceptably similar to the desired profile, the dimensions of the mask are modified. The profile of the waveguide formed using the modified mask dimensions is again modeled, and the modeled waveguide profile is compared with the desired waveguide profile. This process is repeated until the modeled profile is sufficiently similar to the desired profile. After the mask dimensions are selected, the mask is formed on the substrate, and the compound semiconductor waveguide is formed on the substrate using selective area growth.

7 Claims, 5 Drawing Sheets

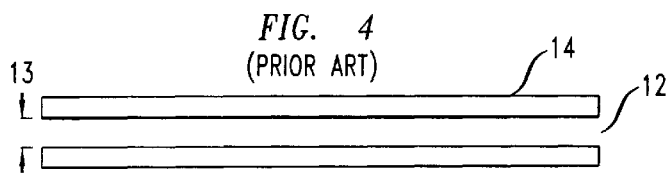
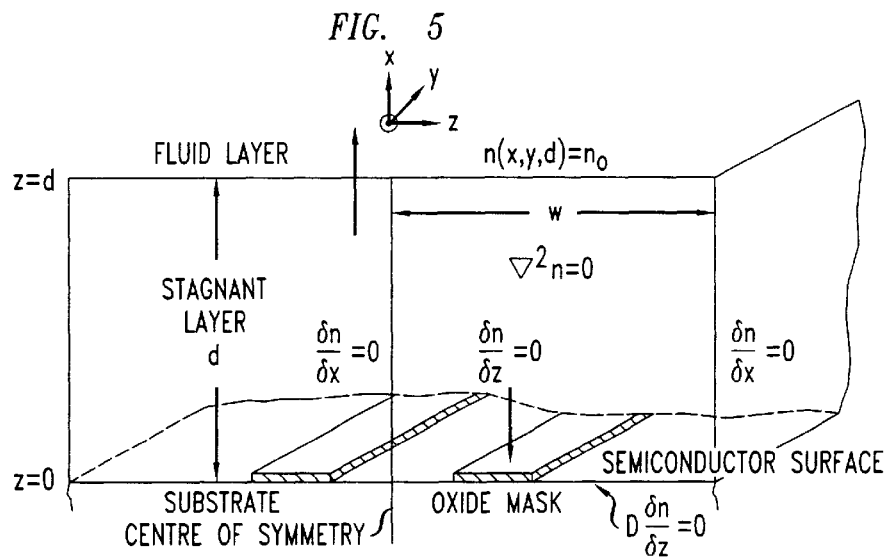
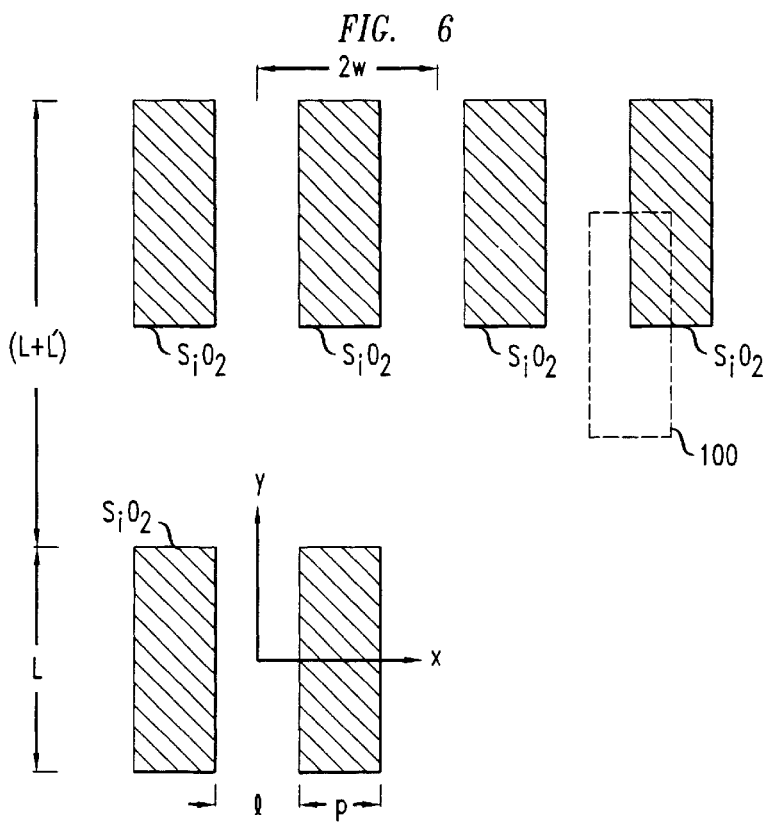

PROCESS FOR FABRICATING AN OPTICAL WAVEGUIDE

BACKGROUND OF THE INVENTION

1. Technical Field

The present invention is directed to a process for making a tapered waveguide interconnect for optical devices.

2. Art Background

In integrated circuits (ICs), semiconductor devices are integrated by forming metal wires in the semiconductor chip. The metal wires provide the desired electrical interconnection between the semiconductor devices. Metal wires, however, cannot be used to similarly integrate optoelectronic devices, because the operating frequency of optoelectronic devices is much higher. A waveguide structure is therefore required to integrate opto-electronic devices. Unlike the wire used to connect semiconductor devices, the waveguide interconnect must have a certain thickness, bandgap, and strain profile to provide the desired interconnection. Consequently, the process for making such waveguide interconnects must be able to provide waveguides that meet the specifications.

One current technique that is used to fabricate these interconnect waveguides is referred to Selective Area Growth (SAG). This process is described in Gibbon, M., et al., "Selective-area low-pressure MOCVD of GaInAsP and related materials on planar InP substrates," Semicond. Sci. Technol., Vol. 8, pp. 998–1010 (1993) (Gibbon et al.), which is hereby incorporated by reference. Referring to the schematic cross-section in FIG. 1, in the SAG process, pads 12 that define the desired configuration of the waveguide are formed on a semiconductor wafer 10. In Gibbon et al. the substrate is an Indium-Phosphide (InP) substrate and the pads are a dielectric material such as silicon dioxide ($SiO_2$) 12. Silicon dioxide is referred to as oxide hereinafter. Vapor phase epitaxy, e.g., Metal Organic Chemical Vapor Deposition (MOCVD), is then used to deposit the waveguide material 14, typically a semiconductor material such as Gallium-Indium-Arsenide-Phosphate (GaInAsP). The semiconductor material 14 does not grow on the portions of the substrate 10 that are covered by the oxide pads 12.

As noted in Gibbon et al., the composition and thickness of the waveguide material 14 changes in proximity to the pads. Specifically, the growth of the waveguide material is enhanced adjacent to the oxide pads 12. This growth enhancement effect of the oxide pads 12 on the growth of the waveguide material must be considered in placing the oxide pads on a substrate to define the substrate region on which the waveguide will be formed by SAG. The growth enhancement varies with both the dimensions of the oxide pads 12 and the distance from the oxide pads. Thus, designing an oxide mask for SAG is not simply a matter of determining the desired waveguide dimensions and forming oxide mask that defines a space corresponding to the desired waveguide dimensions. Jones, A. M., et al., "Integrated optoelectronic device by selective-area epitaxy," SPIE, Vol. 2918, pp. 146–154 (1996), which is incorporated by reference herein, note the problem associated with using SAG to form a waveguide.

One example of a device that is formed using SAG is an expanded beam laser. An example of an expanded beam laser 30 is illustrated in FIG. 2A. As illustrated in FIG. 2A, an expanded beam laser 30 has a first section 31 which transfers the mode of the laser beam to the underlying waveguide 32. The underlying waveguide is slowly tapered in a second section 33 to expand the mode of the laser.

Another example of a device formed using SAG is an electroabsorption modulated laser (EML). In the EML device a laser is optically integrated with a modulator. An example of an EML structure is illustrated in FIG. 2B. The device also has a first section 31 (the gain section) and a second section 34 (the modulator section) and a tapered section 33. However, unlike the device illustrated in FIG. 2A, all of these sections make up the waveguide and all of the layers 42, 43 and 44 are tapered. Such a device is described in Thrush, E. J., et al., "Selective and non-planar epitaxy of InP, GaInAs and GaInAsP using low pressure MOCVD," Journal of Crystal Growth, Vol. 124, pp. 249–254 (1992), which is hereby incorporated by reference. In such devices, the taper section 33 is formed by SAG. The taper must be carefully controlled in order to obtain the desired mode expansion (for devices of the type shown in FIG. 2A), or to minimize power loss while retaining desirable modulator properties (for devices of the type shown in FIG. 2B).

As noted in Jones et al., the dimensions of the dielectric pads are used to control the thickness and the composition of the waveguide material formed on the substrate. Jones et al. models the epitaxial MOCVD deposition process and uses the model to determine the dimensions of the oxide pads and the distance between those pads to provide a waveguide with a desired thickness.

However, the Jones et al. model is a two dimensional model that cannot be used to control the profile of the waveguide. As used herein, the profile of the waveguide is the taper of the waveguide as it transitions from a first thickness (e.g. the thicker laser section) to a second thickness (e.g. the thinner mode expander section). Currently, there is no process for determining a dielectric mask configuration that will provide a waveguide with a desired profile formed by an MOCVD process. Trial and error is used to determine the mask configuration that provides the desired profile. Because the profile of the waveguide must be configured precisely in order to use the waveguide to monolithically integrate an opto-electronic device (e.g. a laser) and a fiber or waveguide, it can take many iterations over a long period of time to design a mask for growing a waveguide with a desired taper on a substrate with an MOCVD process. Accordingly, a process for designing a dielectric mask for use in fabricating a waveguide with a desired profile is desired.

SUMMARY OF THE INVENTION

The present invention is directed to a process for fabricating an opto-electronic device in which is an optoelectronic component is monolithically coupled to a waveguide with a desired profile. Examples of opto-electronic components are lasers, optical amplifiers, and modulators.

In the process, the desired waveguide configuration is provided. The waveguide has at least three portions, each with its own set of dimensions. The first portion has a first height and the second portion has a second height that is different from the first height. Typically the first portion also has a composition that is different from the composition of the second portion. In the first and second portions, it is advantageous if the height is uniform, i.e. the height does not substantially vary with either length or width. The third portion links the first portion and the second portion and thus the height of the third portion transitions from the first height at a point adjacent to the first portion to the second height at a point adjacent to the second portion. The waveguide profile, as used herein, is the relationship between the height of the waveguide and its length or width. In the first and second portions of the device, the desired profile is uniform. In the third portion, the desired profile is a desired change in the height of the waveguide as it transitions from the first height to the second height.

Components and waveguides are formed of compound semiconductor materials (e.g. silicon-germanium and III-V semiconductors). The composition is changed by varying the relative amounts of the elements that make up the compound semiconductor. Consequently, when it is stated herein that the composition of the first portion is different from the composition of the second portion, it means that the relative amounts of the elements that make up the compound semiconductor in the first portion is different than the relative amount of the elements that make up the compound semiconductor in the second portion. The process of the present invention provides a device with the desired composition as well as the desired profile.

Also, although the present invention is described in terms of two monolithically integrated components and a waveguide that transitions from a first height to a second height, one skilled in the art will appreciate that, in certain embodiments, more than two components are monolithically integrated. Thus, in certain embodiments the device has more than one waveguide with attendant profiles that are different from the profiles of one or more of the other waveguides. A top view of such a device is illustrated in FIG. 3. In the device 50, illustrated in FIG. 3, four lasers 51a, 51b, 51c, and 51d are monolithically integrated with a single coupler 52, which is monolithically integrated with a single amplifier 53, which, in turn, is monolithically integrated with a modulator 54. The device is formed on a substrate 60. In the device 50, at least one of the components 51a–d, 52, 53, and 54 has a height (the height (thickness) of a component is its height from the plane of the substrate 60) that is different from the height of at least one of the other components. In some embodiments, the height of each component is different. Also, in the device 50, at least one waveguide 55–60 has a profile (i.e. a change in height as a function of distance) that is different from at least one other waveguide profile. In certain embodiments, each waveguide 55–60 has a profile that is different from the other waveguide profiles.

One skilled in the art will understand that the desired profile will depend on several factors. For example, a waveguide having an expander region and an active region has a gradual taper of the expander region to expand the mode. The profile of such a waveguide is determined by first considering the desired growth enhancement. The selected profile maintains free carrier absorption and radiation losses within acceptable limits. The profile of the expander section is tailored to provide the desired interface reflections. The profile of the expander section is also designed so that the expander section couples efficiently with other waveguides on the same optical bench.

Also, because compound semiconductor (e.g. InP) wafers and processing are expensive, it is advantageous to design a waveguide that takes up as little room as possible. With these considerations in mind, dielectric mask dimensions are selected to provide a waveguide with the desired profile using an MOCVD deposition technique.

A first mask configuration is selected to provide a waveguide that has the desired dimensions in the portion or portions of the device in which a uniform profile is desired. As described in Jones et al., this is relatively straightforward because of the known effects (i.e. growth enhancement) of the dielectric material on MOCVD deposition. Pad dimensions, and the space between the pads are selected to provide a section or sections with the desired length, width, and height.

As previously mentioned the dielectric pads enhance the MOCVD deposition rate in the areas proximate to the mask pads. A certain distance from the pads, the MOCVD deposition rate is unaffected by the dielectric mask pads. Thus, in certain embodiments, the height of one or more sections of the device is the thickness of the MOCVD film deposited on the wafer in regions where the MOCVD deposition is unaffected by the dielectric pads.

Consequently, in the process of the present invention, the compositional and dimensional profile of the waveguide is provided by the desired device function and performance. A mask design is then selected that will provide a first section of the waveguide with the desired dimensions when a layer of a compound semiconductor material is deposited on a substrate on which the mask is formed using MOCVD. The desired profile of the waveguide as it transitions from the first region to the second region is obtained by modeling the effect of the end of the mask on the MOCVD deposition rate and comparing the modeled waveguide profile with the desired waveguide profile. The mask design is then modified based upon the comparison in order to obtain a closer correspondence between the desired profile and the modeled profile. The mask design is modified to affect the taper of the waveguide from the first height to the second height while preserving the desired height in both the first and the second regions of the waveguide.

BRIEF DESCRIPTION OF THE DRAWINGS

FIG. 4 (Prior Art) is a top view of a dielectric mask used to form a waveguide.

FIG. 5 illustrates the geometry and boundary conditions used in the three-dimensional model of the selective area MOCVD growth.

FIG. 6 illustrates the mask dimensions used in the three-dimensional model.

DETAILED DESCRIPTION

Figure 2A:
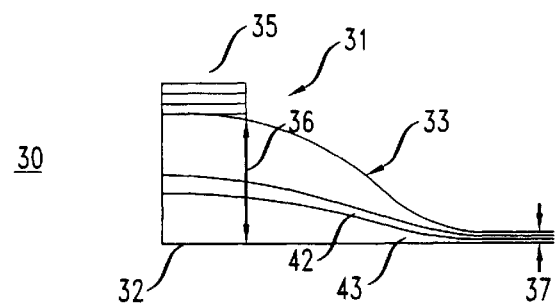
FIG. 2A (Prior Art) is a sideview of a laser monolithically integrated with a beam expander.

The present invention is directed to a process for fabricating a waveguide that is monolithically integrated with an active opto-electronic component such as a laser, modulator, or optical amplifier. The waveguide is typically fabricated using an MOCVD process. One example of such a waveguide is illustrated in FIG. 2A. The waveguide 30 has a first section 31 and a second section 32. The first section 31 is used to transfer the laser beam from laser 35 into the underlying waveguide 32. The second section 32 expands the mode of the laser beam. The second section 32 has a first height 36 under the laser 35 and a second height 37 in the mode expansion section. The second section 32 of the waveguide has a section 33 that tapers from first thickness 36 to second thickness 37. As previously noted, this tapered section is referred to as the waveguide profile. The word "profile" is also used to refer to the height uniformity in the first section 31 of the waveguide. As noted below, height and composition uniformity in the first section is desired to ensure adequate device performance. The waveguide profile affects the performance of the device. Therefore, if the actual profile does not substantially conform to the desired profile, the waveguide will not function optimally.

The profile of such a device is selected by determining the requisite thickness and composition of the waveguide as it transitions from the first height to the second height. In the example where the waveguide expands the mode of a laser beam, the lasing wave must not be absorbed by the waveguide. Consequently, the composition and thickness of the waveguide are varied from the portion of the waveguide into which the laser beam is coupled to the mode expander so that the waves of radiation will propagate without undue loss.

The waveguides of the present invention are made of compound semiconductor materials (e.g. III-V semiconductors, silicon-germanium semiconductors, etc.). One skilled in the art is aware that III-V semiconductors are composite materials formed from at least one element from Group III and at least one element from Group V of the Mendeleev Periodic Table. Indium phosphide (InP) is one example of a III-V semiconductor. Gallium indium arsenic phosphide (GaInAsP) is another example of a III-V semiconductor having two elements from Group III and two elements from Group V.

Variations in waveguide composition are accomplished by varying the relative amount of the Group III and Group V elements in an MOCVD deposition atmosphere. However, the growth rate of the III-V semiconductor material is not completely independent of the relative amounts of the Group III and Group V elements in the MOCVD atmosphere. As previously mentioned, the dielectric pads also affect the growth rate of the compound semiconductor material. Specifically, the growth rate is enhanced by relative proximity to the dielectric pads. To the extent that the relative amounts of the Group III and Group V elements in the deposition atmosphere also affect the growth rate, such effects, in addition to proximity to the dielectric pads, must also be considered in order to obtain a waveguide with the desired profile.

The thickness of the first (thicker) section is determined by the optical mode confinement factor in the active region and good mode transfer efficiency. The thickness of this section is also limited by the fact that the efficiency of the transfer from first (thicker) section to the second (thinner) mode-expanding section depends upon the taper from the thicker section to the thinner section. Based upon these considerations, the dimensions of the dielectric mask are selected that will provide a thicker section with the selected thickness. The selected thickness is obtained by the growth enhancement between the dielectric pads of the mask.

The selected profile maintains free carrier losses and radiation losses within acceptable limits. The various dimensions of the waveguide depend upon the desired device. These issues will be discussed in the context of the device depicted in FIG. 2A. However, one skilled in the art will appreciate that the present invention provides a process for obtaining a waveguide with a tapered profile generally, and that the devices specifically discussed are simply examples of devices having a tapered profile.

In the device depicted in FIG. 2A, a laser 35 is monolithically integrated to a mode expander 32. The thickness 36 of the first section 31 is selected based upon the desired mode coupling between the laser 35 and the mode expander 32. As a general principle, a thicker first section is better for this purpose. A mask is also selected that will provide thickness and composition uniformity (i.e. a planar or flat surface) throughout the first section 31. Generally, the flatter the surface in the first section, the better the device performance that is obtained.

The need for compositional and surface uniformity in the first section is described in the context of a distributed feedback laser (DFB). A DFB has a number of different layers, each layer being a different region of the laser (e.g., grating regions, gain regions, spacer regions, etc.). The DFB has an optical mode profile transverse to these layers. The modal or effective index of the laser ($n_{eff}$) is determined by the bandgap (i.e. composition of the layer), thickness and refractive index of the individual layers that make up the laser. The grating region of the DFB is the region wherein the longitudinal refractive index varies in a periodic manner, with period A. Proximate to the grating region is an active (gain) region where the optical mode will experience gain. Light having a wavelength equal to $2n_{eff}\Lambda$ will be efficiently diffracted by the grating. This diffraction gives rise to an effective reflectivity at this wavelength which mimics mirror reflectivity which, in turn, allows for laser action to occur at this wavelength (denominated the DFB wavelength). If there are variations in thickness or composition in the active layers, then $n_{eff}$ will vary with length. Such variations are not desired, because such variations effectively reduce the grating length, reduce the output power of the laser, and increase the threshold current.

The length of the first section is determined by a longitudinal laser calculation. This calculation describes the wavelength shift as a function of the flatness of the first section. It is advantageous to keep the first section as flat as possible, thereby keeping the wavelength as flat as possible.

The profile of the tapered region 33 is tailored to reduce free carrier absorption. Specifically, if the profile is too short, too much of the signal will escape from the waveguide. If the profile is too long, there will be an undesirable free carrier loss.

The thickness 37 of the second (thinner) section is determined by the desired coupling efficiency with other waveguides or fibers on the same optical bench. As one skilled in the art is aware, this thickness is determined by mode matching considerations between the thinner section and the other waveguides or optical fibers.

Also, because III-V (e.g. InP) wafers and processing are expensive, it is advantageous to design a waveguide that takes up as little room as possible. With these considerations in mind, dielectric mask dimensions are selected to provide a waveguide with the desired profile using an MOCVD deposition technique.

Figure 1:
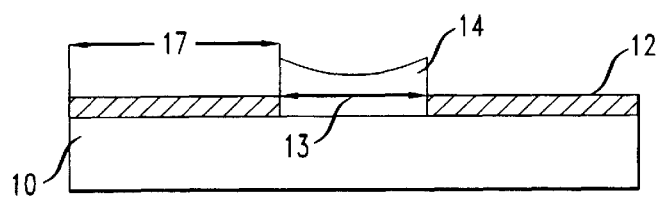
FIG. 1. (Prior Art) is a cross-section of a semiconductor substrate that illustrates the effect of a dielectric mask on selective MOCVD deposition.

A side view of a typical mask configuration is illustrated in FIG. 1. A top view of the mask is illustrated in FIG. 4. The mask has two pads 12, made of a dielectric material such as $SiO_2$. The pads 12 are a distance 13 apart. That distance is selected to provide a waveguide with the desired height. At the end 14 of the pads 12, the MOCVD growth enhancement caused by the pads 12, begins to taper off. Thus, the growth enhancement at the end 14 of the pads 12 is less than the growth enhancement in the interior portions of the pads 12. Since the first section 31 of the waveguide 30 is required to be of uniform height, the length of pads 12 is the length needed to provide a uniform MOCVD growth enhancement for the length of the first section of the waveguide. In the context of the present invention, growth enhancement is the increase in the MOCVD growth rate attributed to the pads compared with the MOCVD growth rate at a point on the substrate where the growth rate is unaffected by the pads.

Figure 2B:
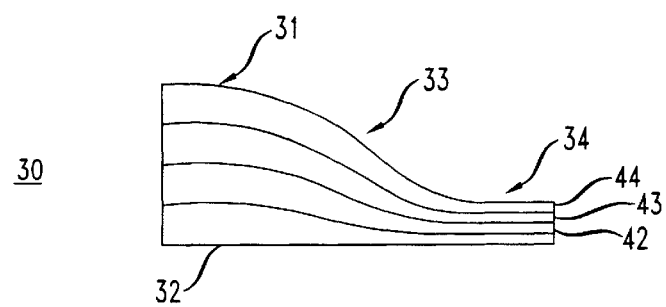
FIG. 2B (Prior Art) is a sideview of a laser monolithically integrated with a modulator.
Figure 3:
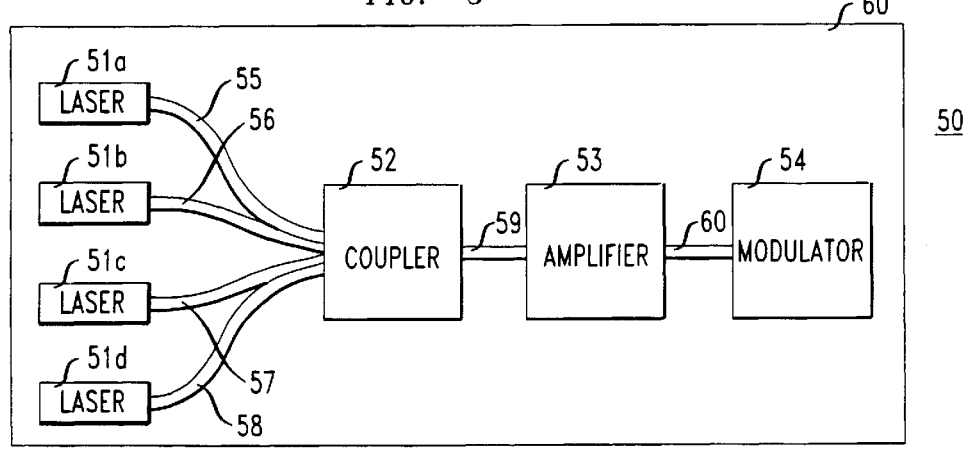
FIG. 3 is a top view of example of an device having a plurality of components monolithically integrated on a single substrate.

In an EML device such as the one illustrated in FIG. 2B, in which an integrated modulator/laser is produced by selective area growth, compositional and thickness variations occur near the end of the SAG oxide mask. These variations are often significant over lengths of about 100 $\mu$m. Since DFB lasers in EML devices often have active laser lengths of about 300 $\mu$m, it is desirable to control longitudinal composition and thickness variations (along a center line between oxide pads 14) near the edge 12 of the mask. Keeping these variations within controlled limits can avoid degradation of the DFB laser performance due to unwanted variations in thickness and composition.

The mask needed to provide a first section with the desired length, width, and height is readily ascertained using two-dimensional modeling such as described in Jones et al. For a given distance between the dielectric pads, growth enhancement is a function of the width of the dielectric pads. For example, for two oxide pads that are 74 $\mu$m apart, the width of the oxide pads is 76 $\mu$m to obtain a growth enhancement of 1.8. Similarly, two 120 $\mu$m-wide oxide pads that are 40 $\mu$m apart provide a growth enhancement of 2.5. Such growth enhancement is also affected by the MOCVD conditions (e.g. temperature, flow, and partial pressure of the components of the MOCVD atmosphere). Thus, a given growth enhancement is not universal for all MOCVD conditions.

Using this simple mask as a stating point, the MOCVD growth profile at the end of the mask is modeled. This model is necessarily three-dimensional because the growth enhancement at a given point on the substrate surface depends upon the distance of that point from the end of the mask. Suitable three-dimensional models are based on either vapor phase diffusion or surface diffusion. The following is a description of a three-dimensional vapor phase diffusion model.

The model assumes that the spatial distribution of the waveguide material at the wafer surface is controlled by steady state diffusion from a nutrient (fluid) layer, through a stagnant boundary layer, to the wafer surface. The stagnant boundary layer is formed by the laminar flow of molecular hydrogen carrier gas.

In the embodiment of the present invention wherein the compound semiconductor is a III-V semiconductor, the model also assumes that the group III species present in the nutrient layer controls the growth rate of the III-V semiconductor material (e.g. InGaAsP). If the relative amount of In and Ga in the nutrient layer is changed, the growth rate will change. The model therefore considers the relative amounts of the Group III elements in the nutrient layer in determining the growth rate of the III-V semiconductor material. The example of the model described herein reflects conditions under which no significant amount of the III-V semiconductor material is deposited on the dielectric mask. However, the model described herein is adaptable to model deposition conditions under which semiconductor material is deposited on the dielectric mask.

Referring to FIG. 5, the geometry and boundary conditions used in the three-dimensional vapor-phase model of selective area MOCVD growth are illustrated. The concentration of the group III precursors, n(x,y,z) are assumed constant in the fluid layer:

$$n(x,y,d) = n_o \qquad (1)$$

where d is the height of the stagnant layer. In the stagnant layer (0<z<d), the flux satisfies Fick's law ($J = -D_v \text{grad}(n)$) where $D_v$ is the vapor-phase diffusion constant.

There are two material-dependent parameters, $D_v$ and $\kappa$, in the vapor phase diffusion model. Since the vapor phase diffusion constant, $D_v$, is limited by collisions between the group III species in the deposition atmosphere and the background $H_2$ carrier gas, an estimate of $D_v$ is obtained from the following expression derived from the kinetic theory of gases:

$$D_v = \frac{3}{8}\left(\frac{\pi k_B T}{2}\left[\frac{m_1 + m_2}{m_1 m_2}\right]\right)^{\frac{1}{2}} \frac{k_B T}{\sigma P} \qquad (2)$$

where $m_1$ and $m_2$ are the masses of the $H_2$ and metal molecules, $k_B$ is Boltzman's constant, T is for temperature, P is the total pressure and $\sigma$ is the collision cross-section. For a given group III element, $D_v$ depends upon the total pressure within the reactor. Consequently, smaller values of $D_v$ are expected for atmospheric pressure MOCVD growth compared to low pressure growth. Since the masses of the metal molecules (e.g. trimethyl indium, trimethyl germanium) are much greater than the mass of molecular hydrogen, the reduced mass in equation (2) is approximately equal to the mass of hydrogen. Therefore, the difference between the diffusion constants for TMI and TMGa lies primarily in the difference in $H_2$ collision cross-section for these two molecules. Since the size of TMI molecules is about the same as the size of TMGa molecules, these molecules are expected to have virtually identical vapor phase diffusion constants.

Since there are no sources or sinks in the stagnant layer, the conservation of reactants implies that the group III species satisfies Laplace's equation in this region:

$$D_v\left(\frac{\partial^2}{\partial x^2} + \frac{\partial^2}{\partial y^2} + \frac{\partial^2}{\partial z^2}\right)n(x, y, z) = 0. \qquad (3)$$

At the substrate surface, the law of conservation of source flux normal to the substrate requires:

$$D_v \frac{\partial n(x, y, z)}{\partial z}\bigg|_{z=0} = \kappa n(x, y, 0) \qquad (4)$$

where $\kappa$ is the reaction coefficient. Since it is assumed that the reactants do not deposit on the dielectric (oxide hereinafter) mask, $\kappa$ equals 0 on the oxide mask and is not zero on the portion of the substrate not covered by the mask.

Therefore there is one boundary condition on the substrate and another on the mask:

$$\left.\frac{\partial n(x, y, z)}{\partial z}\right|_{substrate} = \left(\frac{\kappa}{D_v}\right)n(x, y, 0) \quad (5a)$$

$$\left.\frac{\partial n(x, y, z)}{\partial z}\right|_{oxide} = 0 \quad (5b)$$

A center of symmetry was assumed to exist at x=0, so that no net lateral flux flows across the vertical boundary x=0 and:

$$\left.\frac{\partial n(x, y, z)}{\partial x}\right|_{x=0} = 0. \quad (6)$$

Similarly, the unit cell in FIG. 5 is assumed to repeat at intervals of 2w along the x-axis and "(L+L')" (shown in FIG. 6) along the y-axis. Consequently, no net flux flows across the surfaces at x=w and x=(L+L')/2

$$\left.\frac{\partial n}{\partial x}\right|_{x=w} = \left.\frac{\partial n}{\partial y}\right|_{y=(L+L')/2} = 0 \quad (7)$$

Equations 1–7 define the vapor phase diffusion model.

However, although the vapor phase diffusion constants of the metal organic species are assumed to be similar, the growth rate constant κ is not. The reaction rate κ equals the quantity $$\frac{1}{6}\alpha v_T\left\{\frac{\xi}{\xi+\eta}\right\}$$

wherein $v_T$ is the thermal velocity of the vapor phase material, α is the adsorption probability, ξ is the surface adsorption rate, and η is the surface desorption rate. For example, since the surface adsorption and desorption for indium is very different very different than the surface adsorption and desorption for gallium, κ(In) >>κ(Ga). Referring to equations 4a and 4b, the spatial dependence of the boundary conditions on ∂n/∂x at the surface z=0 results in a non-uniform distribution of the group III species across the wafer surface. Because the concentration ratio of In to Ga is spatially dependent, there are different thickness, strain and composition profiles across the wafer surface. Since the model does not contain an independent growth parameter, the model cannot predict absolute layer thickness. Instead, the model is used to predict a thickness relative to some known thickness on the semiconductor substrate. One example of a reference thickness is x=w (the transverse boundary). This is typically the thickness of the epitaxial layer at a point on the substrate that is unaffected by the oxide mask.

Once the model problem is set up for a particular reactor, the resulting partial differential equation can be solved by a variety of spectral or finite element techniques. Once the solution of the gas flow problem has been obtained, the solutions for different materials are combined appropriately to obtain the desired material properties of the composite structure. Specifically the thickness ratio, n(x,y,0)/n(w,(L+L')/2,0) is denoted by E. Given the calculated, spatially-dependent, growth enhancements, the quaternary (Q) layer thickness is determined using:

$$t\{In(1-x')Ga(x')As(y')P(1-y')\}=E(Q)t_0. \quad (8)$$

Here, $t_0$ is the thickness of the Q-layer in the field region (determined experimentally). E(Q) depends only on the Group III growth enhancement factors; the group V ratio is assumed to be fixed. Consequently, for a quaternary layer having Ga and As mole-fractions of $x_0$ and $y_0$ in the field region, the growth enhancement is:

$$E(Q)=E\{In(1-x_0)Ga(x_0)As(y_0)P(1-y_0)\}=\{(1-x_0)E(In)+x_0E(Ga)\}. \quad (9)$$

The enhancements for In (E(In)) and Ga (E(Ga)) separately come from solutions of the model. The enhancement as a function of position also results from solutions of the model. The relative amounts of In and Ga also depend upon position. The spatially dependent indium mole fraction is:

$$(1-x')=\{E(In)/E(Q)\}(1-x_0) \quad (10)$$

where E(Q) is given in equation 8.

In the embodiment of the present invention wherein the waveguide has a layer of InGaAsP, that layer may be sandwiched between two layers of indium phosphide (InP). Such a device 30 is illustrated in FIG. 2A. This device has a plurality of layers, each of which has the desired profile. Referring to equation 8, the first layer 41 is a layer of InP (x'=0 and y'=0). The second layer 42 is a layer of InGaAsP in which x'=0.21 and y'=0.41. The third layer 43 is a layer of InP (x'=0 and y'=0). In such a device, layer 42 provides effective waveguiding. The effectiveness of layer 42 is determined by the difference in the index of refraction between the InP layers (41 and 43) and layer 42. The index of refraction information of a layer is obtained from the bandgap and strain of that layer. The desired profile is the combined profile of layers 41, 42, and 43. The above-described composition is for the portion of waveguide defined by thickness 37 in FIG. 2A.

In one simulation, the growth parameter values ($D_v/\kappa$) assumed for 3D simulation were 25 μm for Indium and 183.3 μm for Gallium. In the simulation, the pair of oxide pads are place on an infinite substrate.

Figure 7:
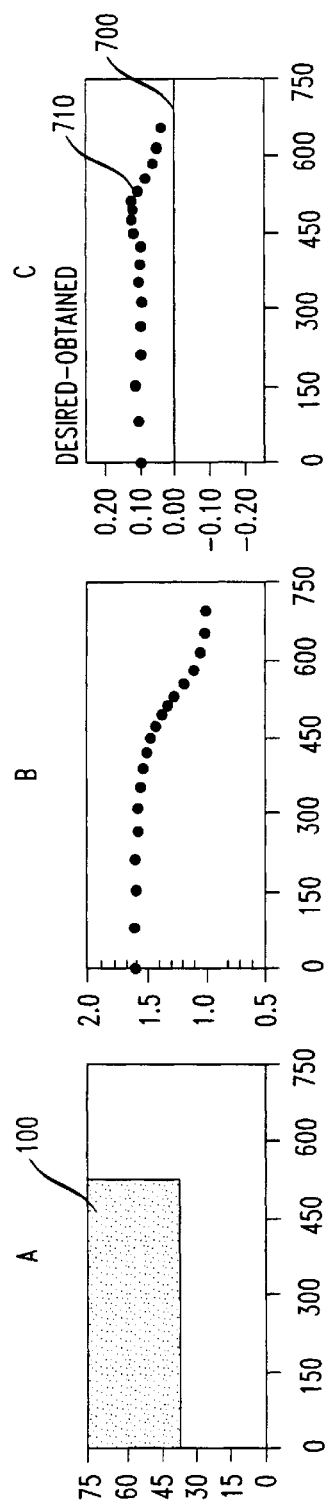
FIG. 7 illustrates a first mask configuration and a comparison of the modeled waveguide profile using the mask configuration with the desired profile.

Using the above-described model, a mask design that provides a waveguide with the desired length of taper is selected. Referring to FIG. 6, based upon the two-dimensional growth model assuming two oxide pads of infinite length, a simple mask shape is chosen that will provide a first section with a desired length, thickness, and substantially uniform height. This is based upon the asymptotic two-dimensional growth enhancement provided by the oxide pads. Such a simple mask shape 100 is illustrated in FIG. 7a (with zero being the center line between two oxide pads, each having a half-width of about 38 μm and a length of about 500 μm (the shape is also illustrated by the dotted rectangle 100 in FIG. 6). Selective area oxide growth simulation is then done. The results of the simulation are illustrated in FIG. 7b. FIG. 7b illustrates the profile of the deposited epitaxial III-V semiconductor material along the center line between the two oxide pads. The y-axis is the growth enhancement of the epitaxial III-V semiconductor material. FIG. 7b illustrates that the growth enhancement begins to taper off near the end of the mask. The simulated profile in FIG. 7b is then compared with the desired profile in FIG. 7c. The mask design is then adjusted based upon the difference between the simulated profile and the desired profile. The process is then repeated until the desired correspondence between the simulated profile and the desired profile is obtained.

EXAMPLE 1

The expander beam laser that was designed according to the process of the present invention was assumed to have a repeat distance of 150 μm between device centers. A two-dimensional simulation was performed to determine that a growth enhancement of 1.8 is obtained for two oxide pads that are 74 µm apart when the oxide pads are 76 µm wide. Similarly, two 120 µm-wide oxide pads that are 40 µm apart provide a growth enhancement of 2.5. One-half of one mask pad 100 is illustrated in FIG. 7a. (i.e. the shaded portion 100 is 38 µm wide). Similarly, one-half of the distance between the oxide pads 100 is illustrated in FIG. 7a (i.e. one-half the distance between the two mask pads is 37 µm). This partial illustration is adequate in this case because the present example problem is symmetrical.

The 76-74-76 mask was used as a starting point to compute the growth profile illustrated in FIG. 7b. The difference between the desired profile and the modeled profile 710 is illustrated in FIG. 7c. The desired profile is obtained when the modeled profile 710 conforms to the baseline zero (700 in FIG. 7c). A point above the line indicates the amount of additional growth enhancement that is required at a particular point in the structure to correspond to the desired profile. A point below the line indicates the amount of reduced growth enhancement that is required at a particular point in the structure to correspond to the desired profile. FIG. 7c illustrates that the modeled growth enhancement is about 0.1 less than the desired growth enhancement throughout the structure.

Figure 8:
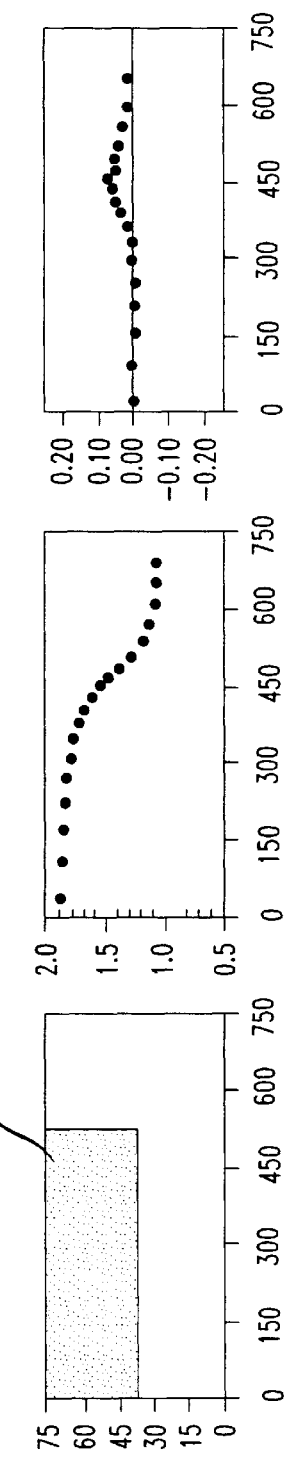
FIG. 8 illustrates a second mask configuration and a comparison of the modeled waveguide profile using the mask configuration with the desired profile.

In order to improve the correspondence between the modeled profile and the desired profile, the width of the oxide pads was increased from 76 µm to 86 µm. The mask is illustrated in FIG. 8a. There was a corresponding decrease in the distance separating the two pads 200 in the mask (from 74 µm to 64 µm). Again, one-half the distance between the two pads 200 is illustrated in FIG. 8a. The growth profile was modeled using the three-dimensional modeling technique previously described and the modeled growth profile is illustrated in FIG. 8b. FIG. 8c compares the desired growth profile with the modeled growth profile. FIG. 8c illustrates that the desired growth enhancement was obtained between the two pads. However, the growth profile falls off too rapidly at the end of the mask (≈430 µm). The modeled growth profile is unacceptable because the growth enhancement decreases too rapidly. That is, the difference between the desired profile and the expected profile at the edge of the waveguide is too large. Such a large difference would cause a radiation loss in the waveguide that is unacceptably large. Although it is expected and desired for the growth enhancement to decrease at the end of the mask, if that decrease is too rapid, the tapered portion of the waveguide will be too steep. If the taper is too steep, the waveguide will be unacceptable because it will cause undesirable laser oscillations and radiation losses will be too high.

Figure 9:
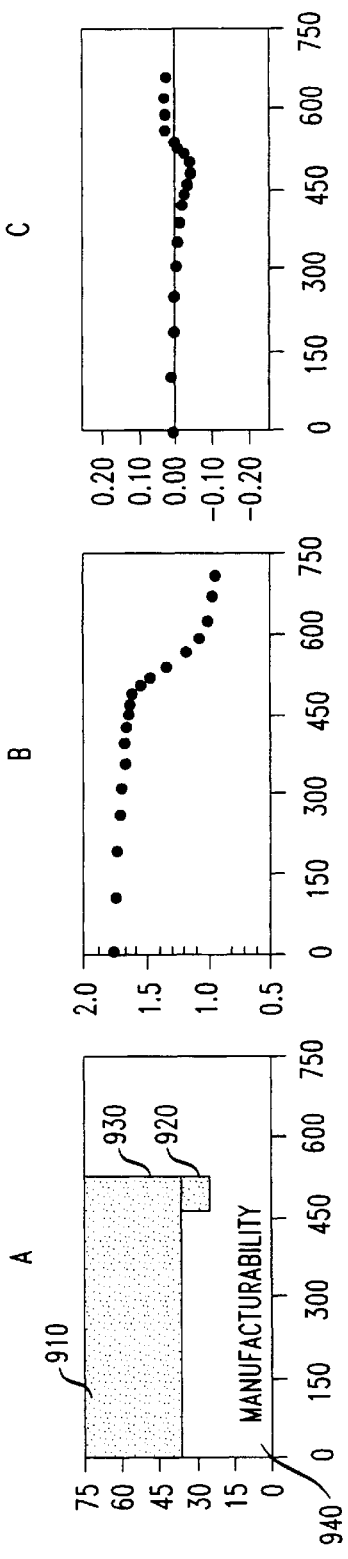
FIG. 9 illustrates a third mask configuration and a comparison of the modeled waveguide profile using the mask configuration with the desired profile.

Since the mask provided the desired growth enhancement in its center, the end of the mask was modified to make the change in growth enhancement at the end of the mask more gradual. This mask is illustrated in FIG. 9a. The mask pad 910 in FIG. 9a has a small extension 920 at the end 930. The small extension 920 projects into the space 940 between the mask pads. The size and placement of the small extension 920 was selected by observing the location of the significant error observed from FIG. 9c. That location was at about 450 µm. The growth enhancement provided by this mask was then modeled, and the modeled profile is illustrated in FIG. 9b. The modeled profile was then compared with the desired profile, and the result of this comparison is illustrated in FIG. 9c. Although the modeled profile in FIG. 9c corresponds more closely to the desired profile in the transition region around 450 µm, the modeled profile still has undesirable oscillations in growth enhancement in the transition region.

The geometry of the extension is modified to remove these oscillations from the desired profile. The mask with the adjusted extension dimensions is illustrated in FIG. 10a. The modeled growth enhancement profile for the mask illustrated in FIG. 10a is illustrated in FIG. 10b. The modeled profile is compared with the desired profile in FIG. 10c. This comparison illustrates the desired growth enhancement (e.g. 1.8) at the center of the SAG was obtained with this mask and the desired taper was obtained through the active region (i.e. the first, thicker section) of the waveguide.

Figure 10:
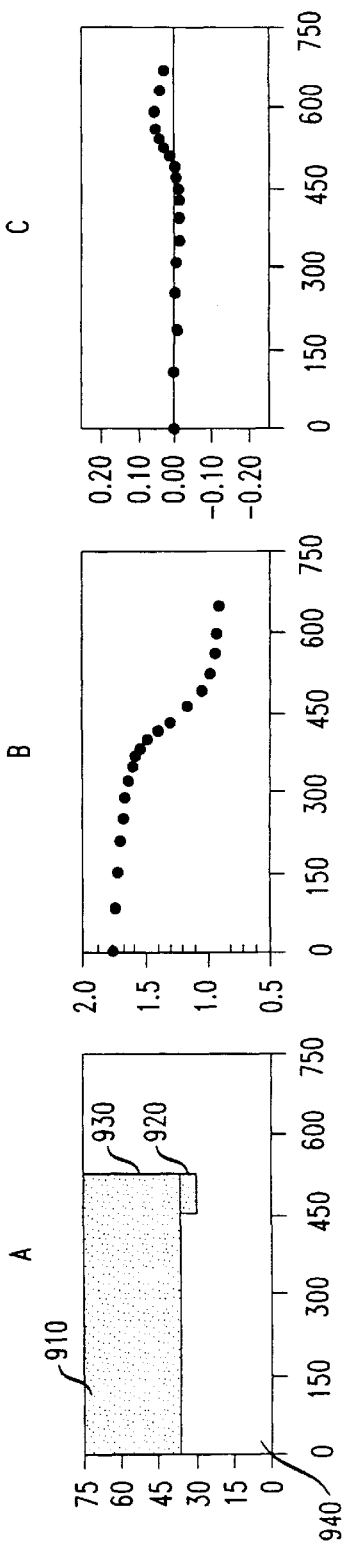
FIG. 10 illustrates a fourth mask configuration and a comparison of the modeled waveguide profile using the mask configuration with the desired profile.

For example, for the waveguide profile illustrated in FIG. 10, the thickness 36 (referring to FIG. 2A) is 1.8 times the thickness 37 and the length of the taper section 33 is 450 µm. The composition of the portion of the waveguide with thickness 37 was InP/InGaAsP/InP wherein the quaternary layer had the previously described composition (with reference to equation 8). The variation in the thick portion of the device 36 is less than seven percent and the device has a radiation loss of less than 1 decibel (dB).

The process of the present invention is used to design a mask to meet particular needs. For example, because of space constraints on the surface of the substrate, a shorter tapered region may be required. In the previous example, the expander length of the waveguide was 300 µm. In some instances, a shorter expander length is required. Using the process of the present invention, the dimensions of a mask for forming a waveguide with a desired expander length are determined by modeling the growth enhancement provided by the mask comparing it with the desired profile, and modifying the mask dimensions until the modeled profile adequately corresponds to the desired profile.

Figure 11:
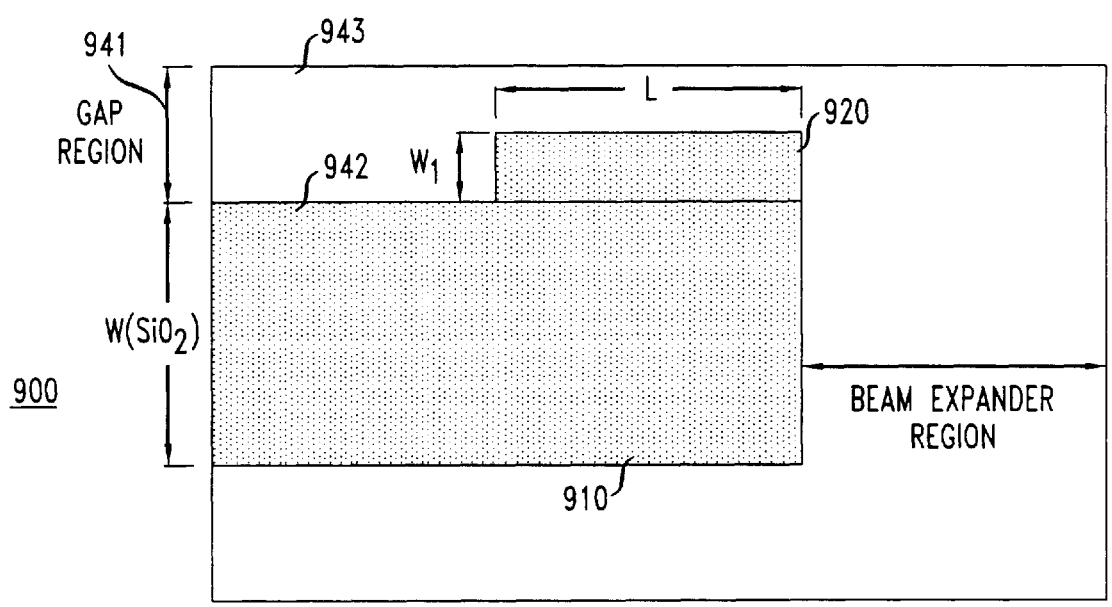
FIG. 11 illustrates the dimensions used to describe the dielectric mask used in the selective area growth process of the present invention.

FIG. 11 illustrates a mask 900 with an extension pad 920 of dimensions $W_1$ and L. The gap region 941 is the distance from the pad 920 edge 942 to the centerline 943 and W is the width of the oxide pad 910. As previously noted, extension pads such as pads 920 illustrated in FIG. 11 are used not only to obtain the desired taper, but to obtain the desired profile uniformity of device at the first height. With reference to the embodiment wherein the device is a DFB laser integrated with a modulator, it is advantageous to keep modal variations in a range where DFB wavelength variations ($\delta\lambda_{DFB}$) are less than about $0.5\Delta\lambda_{stop}$, where $\Delta\lambda_{stop}$ is about 1 nm and is the DFB stop band width. Transforming the equation $\delta\lambda_{DFB}=2\Lambda\delta\eta_{eff}$ provides the relationship, $\delta\eta_{eff}=\delta\lambda_{DFB}/279$. If $\delta\lambda_{DFB}$ is about equal to 0.5 nm (for 1.55 µm laser operation), and $\Lambda$ is about 240 nm, then the variation in $\eta_{eff}$ is about 0.5 nm/2×240 nm which is about 0.5/500 or $10^{-3}$.

In one embodiment of the present invention, the process of mask design is automated. Specifically, the vapor phase diffusion model calculations described above are interfaced with inputs for mask design parameters to automate the process of selecting mask dimensions that provide a waveguide with a desired profile. The model assumes symmetry along the center line of the mask. The mask design process consist of finding the combination of mask dimensions (e.g., width of oxide pad, width of oxide pad extension, distance between oxide pads, length of oxide pad, length of oxide pad extension) that yield both the desired thickness uniformity of the waveguide at the first height and the desired profile as the waveguide transitions from the first height to the second height. A least squares fit analysis can be employed to fit the modeled profile with the desired profile.

It is advantageous if the mask dimensions are selected by breaking the desired mask into pixels and finding the mask dimension that provides the desired profile by modeling the effect of each pixel on the profile.

What is claimed is:

1. A process for forming a waveguide comprising:

selecting the dimensions for a mask made of a dielectric material to be used to form a waveguide to be made of a compound semiconductor material, wherein the waveguide has a desired composition and desired dimensions that include a first height, a second height, and at least one taper from the first height to the second height wherein the mask comprises two dielectric pads that define a spaced-apart distance in which the waveguide is formed, each pad having a first end, wherein the first end of the dielectric pads defines the end of the spaced-apart distance;

modeling the waveguide dimensions and composition of a waveguide formed on a semiconductor wafer within the spaced-apart distance defined by the mask and beyond the end of the spaced-apart distance, wherein the waveguide is formed on the substrate using selective area growth;

comparing the modeled waveguide dimensions and composition of the waveguide with the desired waveguide dimensions and composition of the waveguide until the modeled waveguide dimensions and modeled waveguide composition are sufficiently similar to the desired waveguide dimensions and desired waveguide composition;

forming the mask having dimensions that provide modeled waveguide dimensions sufficiently similar to selected waveguide dimensions on a semiconductor substrate;

depositing a compound semiconductor material on the substrate with the mask thereon to form the waveguide with the desired dimensions and composition.

2. The process of claim 1 wherein the compound semiconductor is selected from the group consisting of silicon-germanium and III-V semiconductors.

3. The process of claim 2 wherein the modeled waveguide dimensions are obtained by modeling the metal organic chemical vapor deposition of the compound semiconductor on a substrate with a dielectric mask with the selected mask dimensions formed thereon and determining the modeled waveguide dimensions from the modeled deposition.

4. The process of the claim 3 wherein the waveguide has a first portion with the first height, the second portion with the second height, and a third portion that connects the first portion with the second portion, wherein the third portion adjacent to the first portion has the first height, the third portion adjacent to the second portion has a second height and the third portion has the tapered profile from the first height to the second height, and wherein the first portion has a first height that is substantially uniform over the length of the first portion and the second portion has a second height which is substantially uniform over the length of the second portion.

5. The process of claim 3 wherein the vapor phase model is used to model the deposition of the compound semiconductor on the substrate at points on the substrate.

6. The process of claim 5 wherein the vapor phase model is used to model the deposition of the compound semiconductor on the substrate as a function of distance from the dielectric mask.

7. The process of claim 4 wherein the first portion has a first material composition that is substantially uniform over the length of the first portion and wherein the second portion has a second material composition that is different from the first material composition and is substantially uniform over the length of the second portion.

* * * * *